(12) United States Patent
Shoji et al.

(10) Patent No.: US 6,882,293 B2
(45) Date of Patent: Apr. 19, 2005

(54) METHOD FOR FORMING JOSEPHSON JUNCTION, JOSEPHSON JUNCTION AND APPARATUS USING JOSEPHSON JUNCTION

(75) Inventors: Akira Shoji, Ibaraki (JP); Hirotaka Yamamori, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/644,801

(22) Filed: Aug. 21, 2003

(65) Prior Publication Data

US 2004/0099861 A1 May 27, 2004

(30) Foreign Application Priority Data

Aug. 21, 2002 (JP) ........................................ 2002-240313

(51) Int. Cl.[7] .............................................. H03M 1/00
(52) U.S. Cl. ........................................ 341/133; 427/63
(58) Field of Search ............................ 257/32; 427/63; 505/325, 190; 341/133

(56) References Cited

U.S. PATENT DOCUMENTS

| | | | | |
|---|---|---|---|---|
| 4,220,959 A | * | 9/1980 | Kroger | 257/32 |
| H873 H | * | 1/1991 | Cukauskas et al. | 427/63 |
| 5,229,361 A | * | 7/1993 | Shiraishi et al. | 505/325 |
| 5,565,866 A | * | 10/1996 | Hamilton et al. | 341/133 |
| 5,656,575 A | * | 8/1997 | Mueller | 505/190 |
| 5,798,722 A | * | 8/1998 | Przybysz et al. | 341/133 |
| 2003/0218164 A1 | * | 11/2003 | Yamamori et al. | |

FOREIGN PATENT DOCUMENTS

| | | |
|---|---|---|
| JP | 61-020377 A1 | 1/1986 |
| JP | 3-76596 B2 | 12/1991 |
| JP | 4-81874 B2 | 12/1992 |
| JP | 20044079882 A * | 3/2004 |

OTHER PUBLICATIONS

Shiro Nagaoka et al, "Microstructure and Superconductivity in Epitaxial MgO/NbN Multilayers"Japan Journal of Applied Physics, vol. 28, No.8, pp. 1367–1372 (Aug. 1989).

Yamamori et al., "NbN/TiN$_x$/NbN/TiN$_x$/NbN double-barrier junction arrays for programmable voltage standards," Applied Physics Letters, vol. 80, No. 8, pp. 1415–1417, American Institute of Physics (Feb. 25, 2002).

Kohjiro et al., "Surface Resistance of Epitaxial and Polycrystalline NbCN Films in Submillimeter Wave Region," IEEE Transactions on Applied Superconductivity, vol. 3, No. 1, pp. 1765–1767, IEEE (Mar. 1993).

* cited by examiner

*Primary Examiner*—Jean Bruner Jeanglaude
(74) *Attorney, Agent, or Firm*—Rader, Fishman & Grauer PLLC (57) ABSTRACT

A Josephson junction has a Si substrate, a two layer film comprising an amorphous MgO layer and a high orientation MgO layer on the Si substrate, and a NbN film or the NbCN film laminated on the two layer film.

21 Claims, 13 Drawing Sheets

METHOD FOR FORMING JOSEPHSON JUNCTION, JOSEPHSON JUNCTION AND APPARATUS USING JOSEPHSON JUNCTION

TECHNICAL FIELD OF THE INVENTION

The present invention relates to a method for forming Josephson junction (device) and a Josephson junction formed by the method and apparatus using the Josephson Junction formed by the method.

DESCRIPTION OF THE RELATED ART

A Josephson junction (device) is an element comprising two superconductors slightly joined, and the junction is used in isolation or joined with a superconductive inductance line so as to serve a function such as frequency-voltage conversion, magnetic flux-voltage conversion, and ultra high-speed/low-power consumption logic switching.

The frequency-voltage conversion function is explained as an example below.

When electromagnetic wave of frequency f is irradiated at a Josephson junction, voltage V shown by the following formula (1) is generated between two terminals of the Josephson junction.

$$V = nf/K_{J-90} \quad (1)$$

In the formula shown above, "n" is an integer, and "$K_{J-90}$" is Josephson constant (=2 e/h=483,597.9 GHz/V).

The voltage "V" in the formula (1) changes only depending on change of the frequency f of the electromagnetic wave to be irradiated, and does not change depending on change of material of the element, dimensions, temperature, etc.

Since the frequency of the electromagnetic wave can be determined with very high accuracy ($1/10^{11}$ of accuracy), voltage that the Josephson junction generates can be also determined with a very high accuracy ($1/10^9$ of accuracy). Such a frequency-voltage conversion function is theoretically unrealizable in elements other than such a Josephson junction. Therefore, in the major standard research organizations in the world, the element using a Josephson junction device is used for the primary standard of voltage.

In almost all Josephson junction devices used for practical application now, Nb/AlOx/Nb junction is used, which is formed by using a heat oxidization film (AlOx) of aluminum as a barrier, and using a niobium (Nb) film as an electrode.

This is because, in case of a Nb/AlOx/Nb junction, (1) an uniform electrical property can be obtained when a large number of junctions are accumulated on a substrate with high density; (2) it is easy to control electrical properties such as criticality current density and usual state resistance; and (3) it is hard for such properties to deteriorate by the heat cycle between the room temperature and cryogenic temperature.

An operation of the Nb/AlOx/Nb junction is mostly performed in liquid helium (4.2 K). This is because the superconductivity critical temperature (Tc) of Nb is relatively low, that is, about 9 K.

Liquid helium can be purchased comparatively easily from a private contractor in advanced nations, such as Japan, the U.S., and Europe. However, the price is 1000 yen to several thousand yen per liter. For this reason, when it is necessary to regularly operate the junction element like a voltage standard element or an element for detecting the millimeter waves or sub-millimeter waves which come from the universe, the cost for cooling down the element is increased.

Moreover, in the country and area where liquid helium cannot be obtained easily, it is difficult to operate such an element itself.

It is possible to cool down and to operate a Josephson junction as a means to solve this problem, using a freezer, without liquid helium. However, such a freezer which can cool down the junction to the liquid helium temperature is very expensive and needs large electric power. For this reason, putting, into practical use, the Josephson junction which can be cooled down and operated with the small freezer of low electric power is desired.

Such a Josephson junction is divided roughly into two groups. A Josephson junction of the first group uses nitriding niobium (NbN) which has a suitable composition ratio or carbonitriding niobium (NbCN) which has a suitable composition ratio as an electrode material. Both niobium compounds have superconductivity critical temperature Tc exceeding 15 K, and such Josephson junction which uses them as material of an electrode can be operated in 8–12 K. This range of temperature is realizable with a commercially available small and low power freezer.

A Josephson junction in the second group uses, as material of an electrode, a high temperature oxide superconductor, especially YBCO which has a suitable composition ratio. The YBCO having a suitable composition ratio has the superconductivity critical temperature Tc exceeding 90 K, and a Josephson junction made from YBCO can be operated also in the temperature exceeding 50 K.

However, technology of accumulating on a substrate the Josephson junctions using high temperature oxide superconductors, such as YBCO, as material of an electrode, and acquiring the uniform characteristic has not been realized yet. For this reason, there is no Josephson junction which can be replaced with present Nb/AlOx/Nb junction other than Josephson junctions belonging to the first group, that is, those using i.e., NbN, or NbCN as material of an electrode.

When a NbN film or a NbCN film is deposited by reactive sputtering on a Si wafer, since crystal lattice compatibility between the Si wafer and the NbN film, or the NbCN film is not good, the formed film turns into a multi-crystal film. The magnetic field penetration depth of the multi-crystal NbN film and the NbCN film is usually about 300 nm. Therefore, in order to avoid an increase of a kinetic inductance, it is necessary to set thickness of the NbN film or a NbCN film used for the electrode of a Josephson junction to 300 nm or more. The thickness is about 3 times as thick as that of the Nb film used for the electrode of a Josephson junction. Increase of the thickness of the Josephson junction electrode brings about increase of the thickness of an insulated layer or a wiring layer, and finally causes exfoliation of the film by increase of the stress in a film.

SUMMARY OF THE INVENTION

To find solutions to this problem, single crystal magnesium oxide (MgO) which has the lattice suitable for use with NbN or NbCN has been tried to use as a substrate. It is known that, under suitable sputtering conditions, epitaxial growth of NbN or NbCN deposited on the single crystal MgO is carried out, and they become a high quality film with few defects. As the result, the magnetic field penetration depth in a film is set to about 100 nm. That is, the above-mentioned problem can be solved by using the NbN film or NbCN film which is formed on the single crystal MgO substrate, for the electrode of a Josephson junction,.

However, commercially available single crystal MgO is very expensive. For example, single crystal MgO with a 3 inch diameter and a 0.5 mm thickness costs 100,000 yen or more per sheet. For this reason, in order to create the general-purpose Josephson junction which uses NbN or NbCN as material of an electrode, it is substantially difficult to adopt a single crystal MgO as a substrate.

It is an object of the present invention to solve the above described problem.

According to the present invention, a method for forming a Josephson junction, comprising the following steps of forming a two-layer film having an amorphous MgO layer and a high orientation MgO layer on a Si substrate, and laminating a NbN film or a NbCN film on the two-layer.

Further, according to the present invention, a Josephson junction may be produced by the method for forming a Josephson junction.

Furthermore, according to the present invention, a two-layer film which consists of amorphous MgO layer and crystal MgO layer having strong orientation is formed on a Si wafer by sputtering, and a NbN film or a NbCN film is deposited on the two layer by reactive sputtering, the product of which is used for an electrode, whereby a Josephson junction is created.

Further, according to the present invention, Josephson junction array has at least one Josephson junction comprising a Si substrate, a two layer film comprising an amorphous MgO layer and a high orientation MgO layer on the Si substrate, and a NbN film or a NbCN film laminated on the two layer film.

Furthermore, according to the present invention, a digital to analog converter has Josephson junction arrays comprising Josephson junctions, wherein at least one of the Josephson junctions comprises a Si substrate, a two layer film comprising an amorphous MgO layer and a high orientation MgO layer on the Si substrate, and a NbN film or a NbCN film laminated on the two layer film.

Still further, according to the present invention, Josephson voltage generating apparatus has a digital to analog converter comprising junction arrays for programmable converter using Josephson junctions, wherein at least one of the Josephson junctions comprises a Si substrate, a two layer film comprising an amorphous MgO layer and a high orientation MgO layer on the Si substrate, and a NbN film or a NbCN film laminated on the two layer film.

Further, according to the present invention, a Josephson voltage standard apparatus has a digital to analog converter comprising junction arrays for programmable converter using at least one Josephson junction, wherein at least one of the Josephson junctions comprises a Si substrate, a two layer film comprising an amorphous MgO layer and a high orientation MgO layer on the Si substrate, and a NbN film or a NbCN film laminated on the two layer film.

According to the present invention, a superconducting sub-millimeter wave oscillator has at least one Josephson junction comprising a Si substrate, a two layer film comprising an amorphous MgO layer and a high orientation MgO layer on the Si substrate, and a NbN film or a NbCN film laminated on the two layer film.

According to the present invention, a superconducting quantum interference device has at least one Josephson junction comprising a Si substrate, a two layer film comprising an amorphous MgO layer and a high orientation MgO layer on the Si substrate, and a NbN film or a NbCN film laminated on the two layer film.

According to the present invention, a superconductivity digital integrated circuit has at least one Josephson junction comprising a Si substrate, a two layer film comprising an amorphous MgO layer and a high orientation MgO layer on the Si substrate, and a NbN film or a NbCN film laminated on the two layer film.

According to the present invention, the NbN film or the NbCN film is used as an electrode.

DESCRIPTION OF THE DRAWINGS

The present inventions will now be described by way of example with reference to the following figures in which.

DETAILED DESCRIPTION OF THE INVENTION

Description of a method according to the present invention will be given below referring to FIG. 1.

Figure 1A:
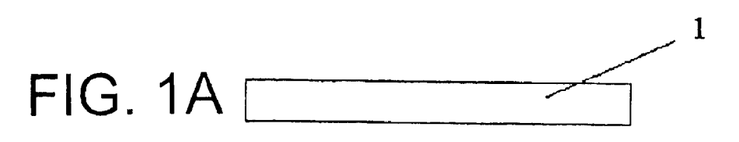
FIGS. 1A–1L shows steps of a Josephson junction forming process.

As shown in FIG. 1A, a Si wafer 1 (a substrate) is washed with pure water. In a sputtering chamber, the surface of the substrate is cleaned and surface adsorption water thereon is removed by argon ion.

Figure 1B:
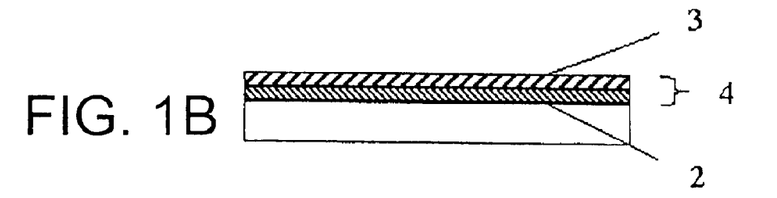

Next, as shown in FIG. 1B, a MgO double layer 4 comprising amorphous MgO film 2 with a 5 nm thickness and a high orientation MgO film 3 with a 5 nm thickness is formed by a sputter deposition.

Figure 1C:
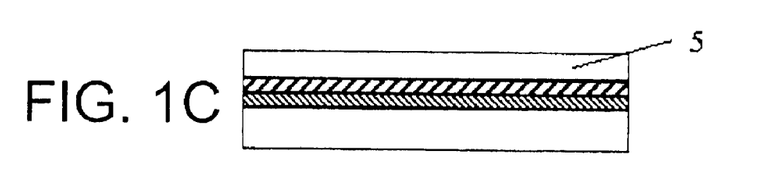

In FIG. 1C, a NbN film 5 with a 100 nm film thickness is formed on the MgO two-layer 4 by reactive sputtering.

Figure 1D:
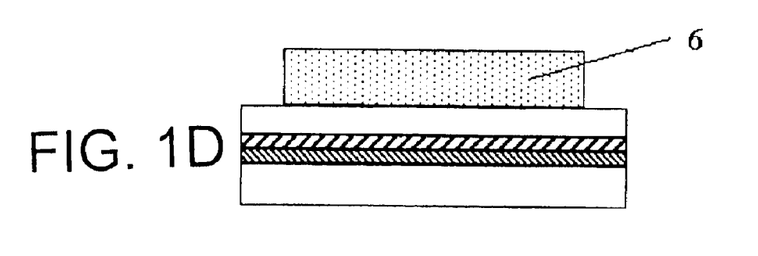

After that, a resist pattern 6 for a lower wiring electrode 7 is formed as shown in FIG. 1D.

Figure 1E:
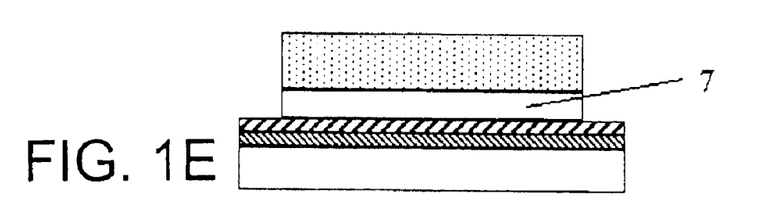

By reactive ion etching, the NbN film 5 is processed and the lower wiring electrode 7 is shaped depending on the shape of the resist pattern as shown in FIG. 1E.

Figure 1F:
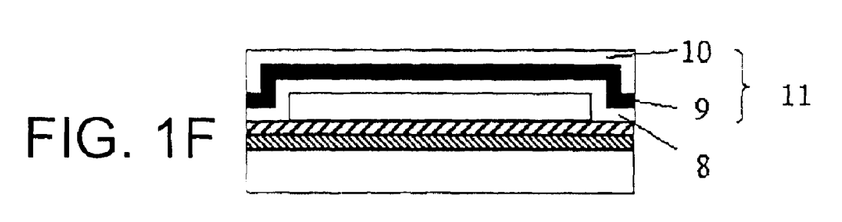

In FIG. 1F, after the processed wafer is returned to the sputtering apparatus and the surface of the wafer is cleaned by argon ion, a three-layer film 11 which consists of a NbN film 8 with a 10 nm thickness, a nitriding titanium (TiN) film 9 with a 35 nm thickness, and a NbN film 10 with a 10 nm thickness is created all over the wafer.

Figure 1G:
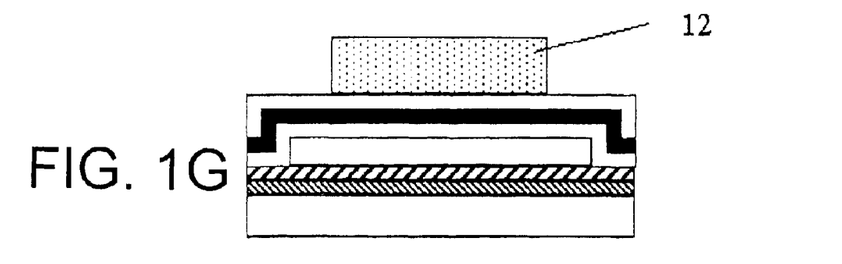

And then, a resist pattern 12 for a junction portion is formed in FIG. 1G.

Figure 1H:
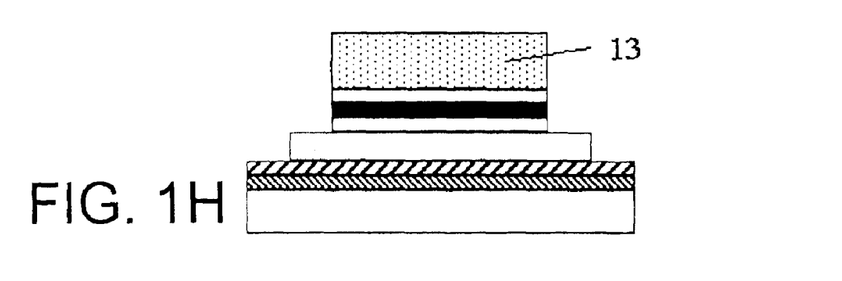

Further, in FIG. 1H, the three-layer film 11 is processed by reactive ion etching so as to form a junction portion 13.

Figure 1I:
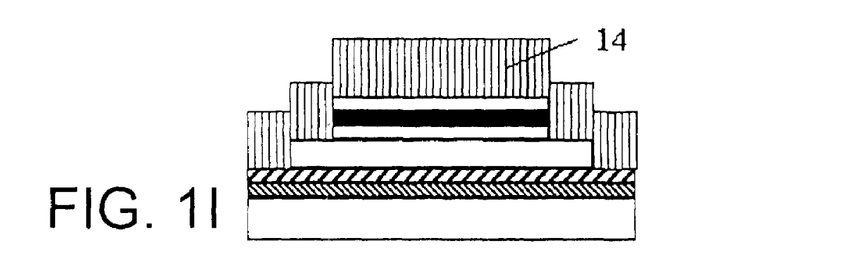

Next, the wafer is moved to another sputtering apparatus and a $SiO_2$ insulation film 14 with a thickness of 100 nm is deposited all over the wafer as shown in FIG. 1I.

Figure 1J:
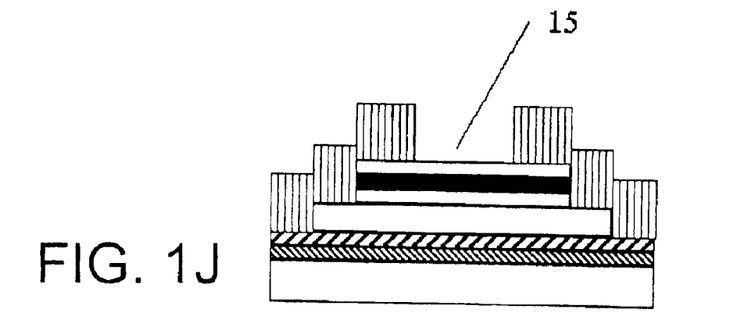

By reactive ion etching, the $SiO_2$ insulation film 14 is processed so as to create a contact hole 15 as shown in FIG. 1J.

Figure 1K:
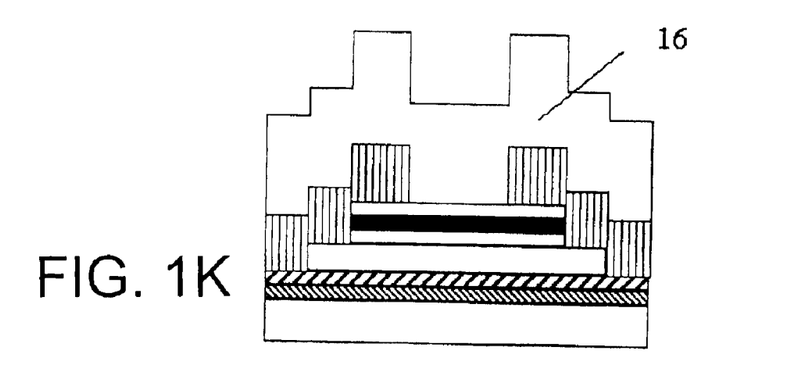

In order to create an upper wiring electrode 17, a NbN film 16 with a thickness of 300 nm is created all over a wafer by reactive sputtering as shown in FIG. 1K.

Figure 1L:
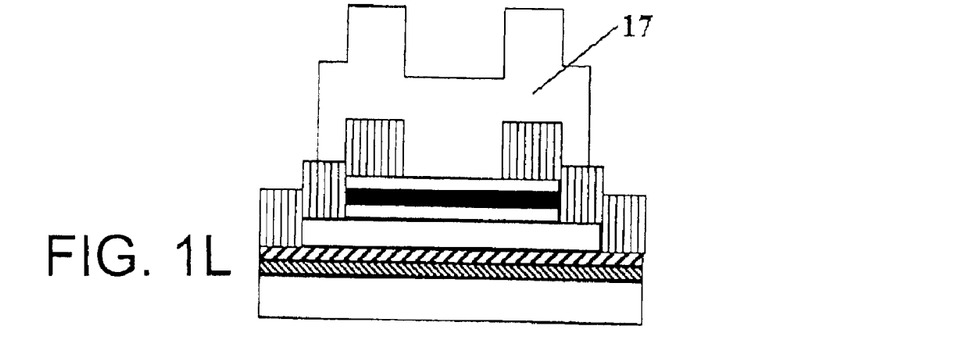

The NbN film 16 is processed by reactive ion etching, and the upper wiring electrode 17 is determined.

Figure 2:
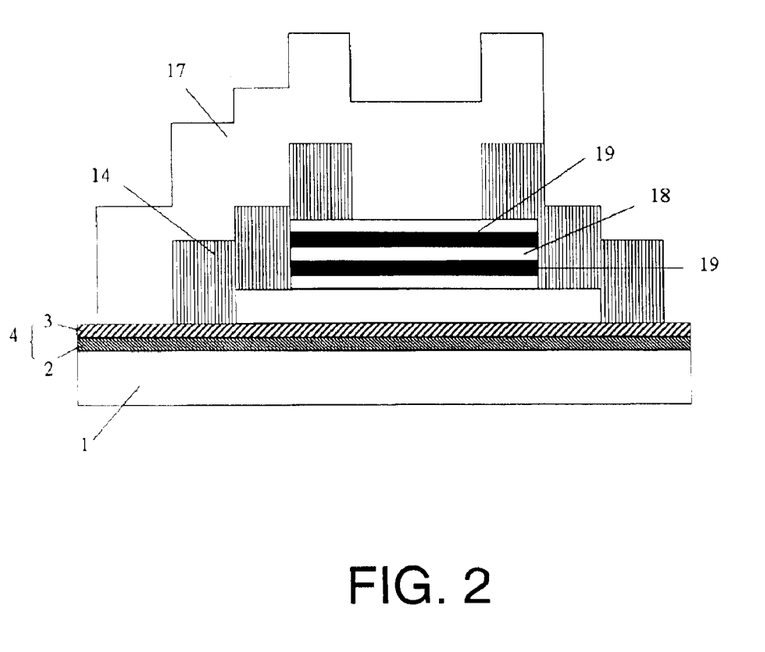
FIG. 2 is a cross sectional view of a double layer laminating type Josephson junction.
Figure 3:
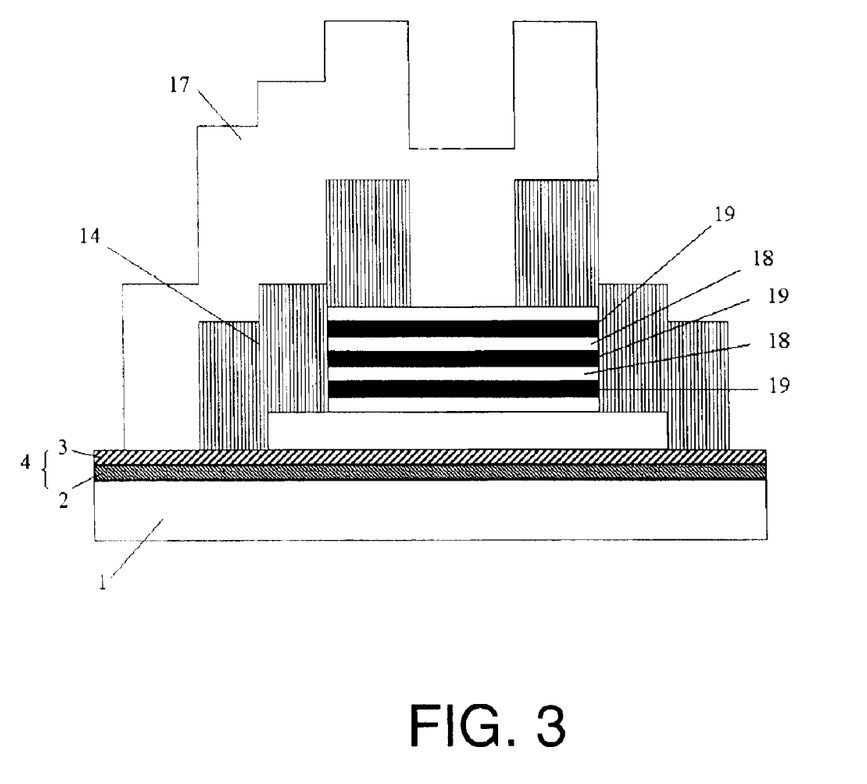
FIG. 3 is a cross sectional view of triple laminating type Josephson junction.

Although the above-mentioned example is a single laminating Josephson junction, the Josephson junction according to the present invention may be used for a two-layer laminating type Josephson junction which has been proposed as shown in FIG. 2. Further, the Josephson junction may be used for a three-layer laminating type Josephson junction as shown in FIG. 3. Also see Yamamori et al., "NbN/TiNx/NbN/TiNx/NbN double-barrier junction arrays for programmable voltage standards," Applied Physics Letters, Vol. 80, No. 8, pp.1415–1417 (2002).

It is desirable to make thickness of a superconductivity middle layer 18 and barrier layers 19 as small as possible in creation of such a multi-layer laminating type Josephson junction from a viewpoint of raising the production yield.

If suitable barrier material, such as TiN, NbN, AlN, and MgO, are chosen, it is possible to make the thickness of the superconductivity middle layer 18 and the barrier layer 19 smaller than that of the conventional multi-layer laminating type Josephson junction.

An epitaxial NbN film and an epitaxial NbCN film have low surface resistance by more than 1 digit lower than that of a polycrystalline film in the frequency band of 0.5–1.0 THz. See Kohjiro et al., "Surface resistance of epitaxial and polycrystalline NbCN films in sub-milimmeter wave region, IEEE Transactions on Applied Superconductivity," Vol. 3, No. 2, pp.1765–1767 (1993).

For this reason, the sub-millimeter wave oscillation element which uses a NbN film or a NbCN film as an electrode is created on the expensive single crystal MgO substrate.

If the method according to the present invention is used, it is possible to create those elements on an inexpensive Si wafer.

Figure 4:
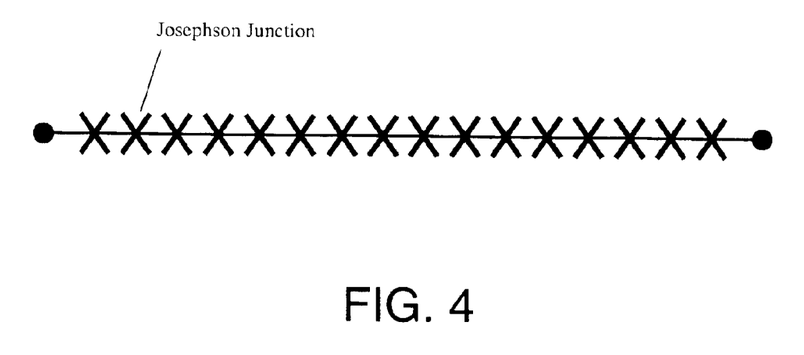
FIG. 4 is a schematic view of a junction array for a programmable Josephson voltage standard.

FIG. 4 shows a junction array for a programmable Josephson voltage standard, in which a plurality of Josephson junctions are connected in series. The Josephson junctions are shown as "X". All or at least one of the Josephson Junctions comprise a Si substrate, a two layer film comprising an amorphous MgO layer and a high orientation MgO layer on the Si substrate, and a NbN film or a NbCN film laminated on the two layer film.

Figure 5:
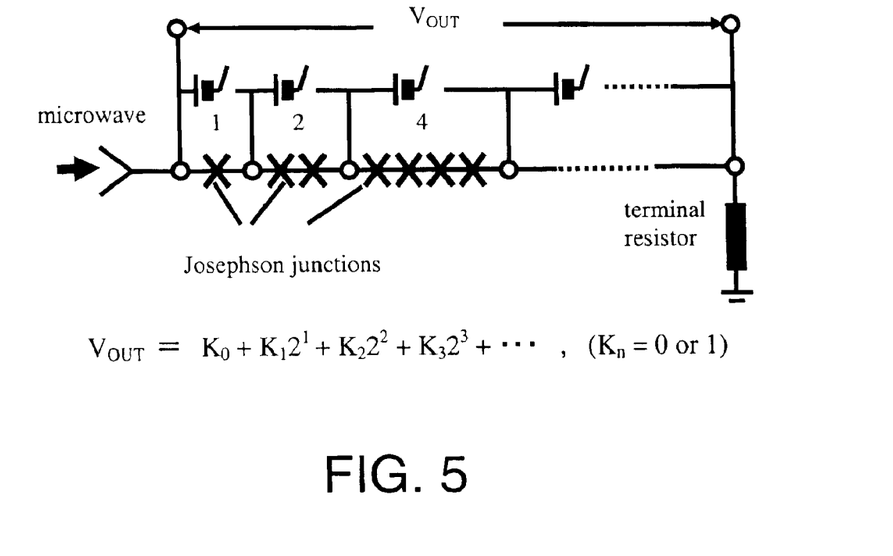
FIG. 5 is a digital to analog converter for a programmable voltage standard according to the present invention.

Moreover, the Josephson junctions according to the present invention can be used for a digital to analog converter. FIG. 5 shows the digital to analog converter for a programmable voltage standard. In FIG. 5, all or at least one of the Josephson junction comprises a Si substrate, a two layer film comprising an amorphous MgO layer and a high orientation MgO layer on the Si substrate, and a NbN film or a NbCN film laminated on the two layer film. The digital to analog converter has a terminal to which microwave is input and a terminal resistor. In the digital to analog converter, the NbN film or the NbCN film is used as an electrode. The output voltage $V_{out}$ is determined by arbitrarily selecting groups of Josephson junctions, whose number is power of 2. The output voltage $V_{out}$ is represented as follows:

$$V_{out}=K_0+K_1 2^1+K_2 2^2+K_3 2^3+\ldots, (K_n=0 \text{ or } 1)$$

Figure 6:
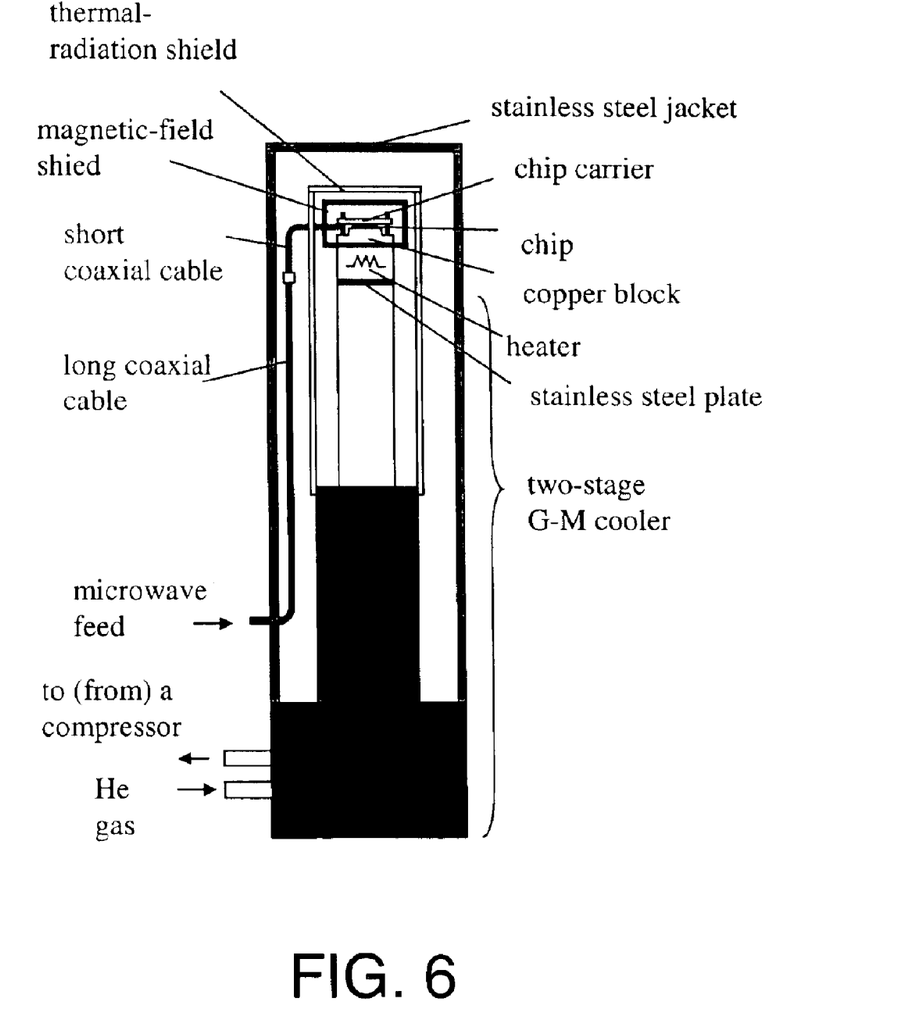
FIG. 6 is a schematic view of a Josephson voltage generating apparatus according to the present invention.

FIG. 6 shows a Josephson voltage generating apparatus (system) using Josephson junction arrays to which the Josephson junctions according to the present invention are applied. The Josephson junction arrays are provided on a chip of the Josephson voltage generating apparatus (system). All or at least one of the Josephson Junctions comprise a Si substrate, a two layer film comprising an amorphous MgO layer and a high orientation MgO layer on the Si substrate, and a NbN film or a NbCN film laminated on the two layer film. The NbN film or the NbCN film is used as an electrode.

Figure 7:
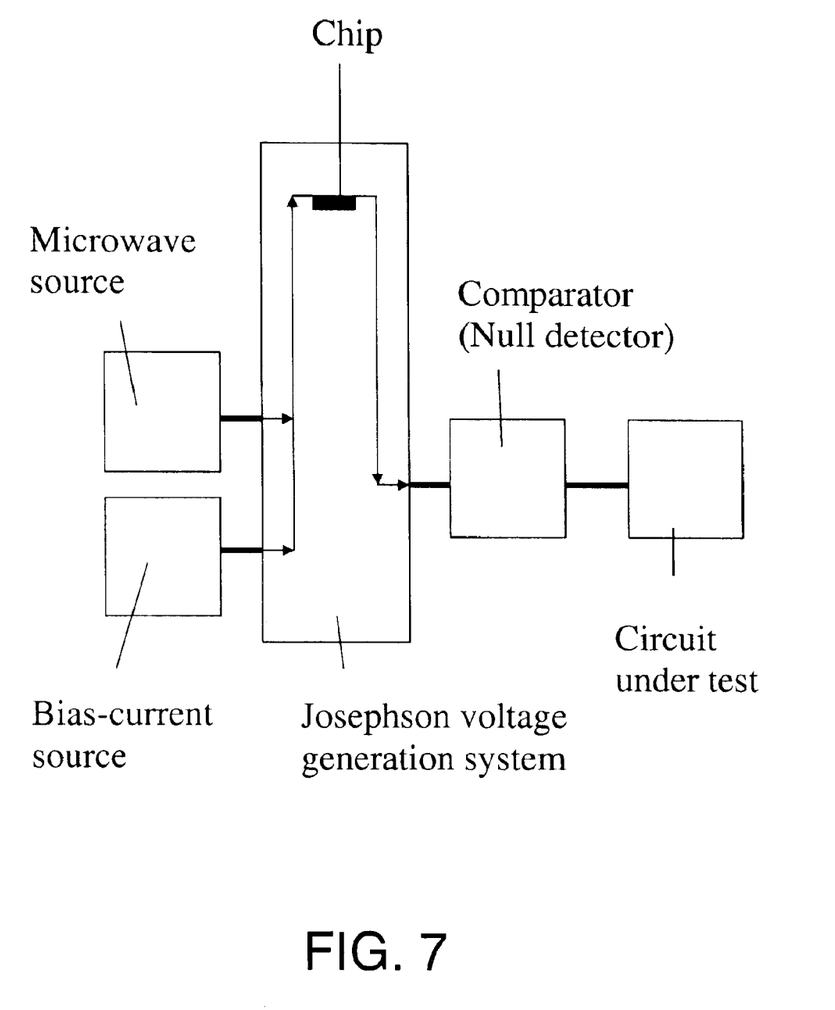
FIG. 7 is a schematic view of a Josephson voltage standard system.

Further, the Josephson voltage may be applied to a Josephson voltage standard apparatus (system). FIG. 7 shows a schematic view of the Josephson voltage standard apparatus (system). A digital to analog converter having Josephson junction arrays comprising Josephson junctions according to the present invention is provided on a chip of the Josephson voltage standard apparatus. All or at least one of the Josephson Junctions comprise a Si substrate, a two layer film comprising an amorphous MgO layer and a high orientation MgO layer on the Si substrate, and a NbN film or a NbCN film laminated on the two layer film. The NbN film or the NbCN film is used as an electrode. In Josephson voltage standard apparatus, the NbN film or the NbCN film is used as an electrode.

Figure 8:
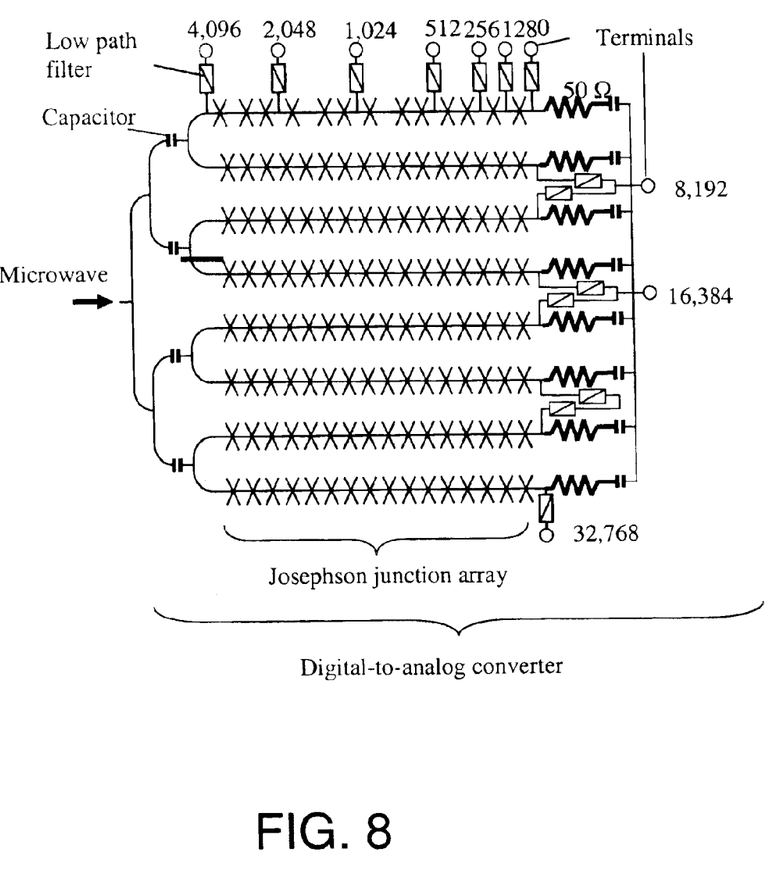
FIG. 8 is a schematic view of a digital to analog converter provided on a chip of the Josephson voltage standard system shown in FIG. 7.

In FIG. 8, a digital to analog converter having Josephson junction arrays for a programmable voltage standard is shown. The digital to analog converter is provided on a chip of the Josephson voltage generating apparatus (system) shown in FIG. 7. The Josephson junctions according to the present invention are provided in each of arrays. Thus, the Josephson junction arrays having the Josephson junctions according to the present invention, are provided in the digital to analog converter, and the digital to analog converter is provided on the chip of the Josephson voltage standard apparatus. All or at least one of the Josephson Junctions comprise a Si substrate, a two layer film comprising an amorphous MgO layer and a high orientation MgO layer on the Si substrate, and a NbN film or a NbCN film laminated on the two layer film. The NbN film or the NbCN film is used as an electrode.

Figure 9:
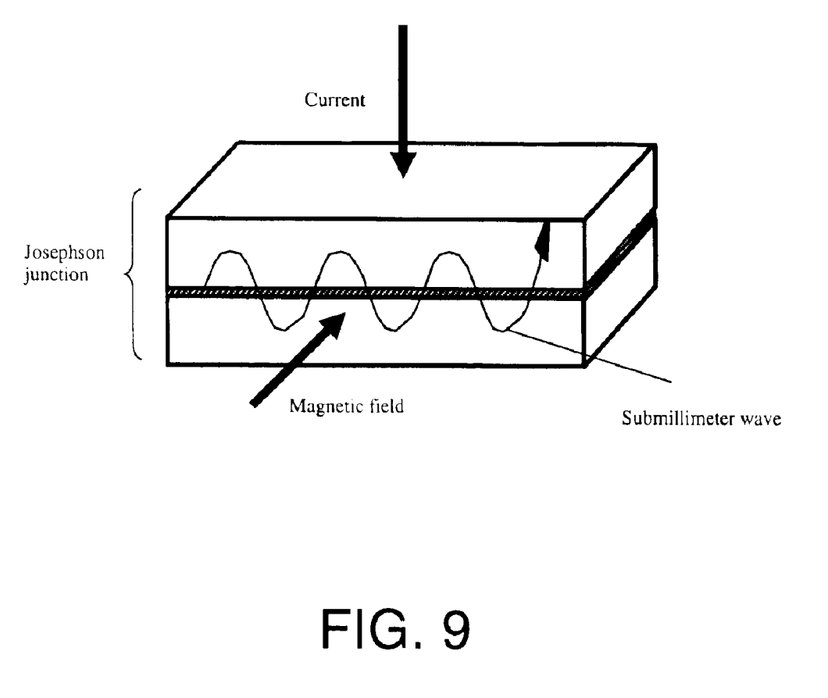
FIG. 9 is a schematic view of a superconducting sub-millimeter wave oscillator according to the present invention.

FIG. 9 shows a superconducting sub-millimeter wave oscillator to which the Josephson junction according to the present invention is applied. The Josephson Junction comprises a Si substrate, a two layer film comprising an amorphous MgO layer and a high orientation MgO layer on the Si substrate, and a NbN film or a NbCN film laminated on the two layer film. In the superconducting sub-millimeter wave oscillator, the NbN film or the NbCN film is used as an electrode.

Figure 10:
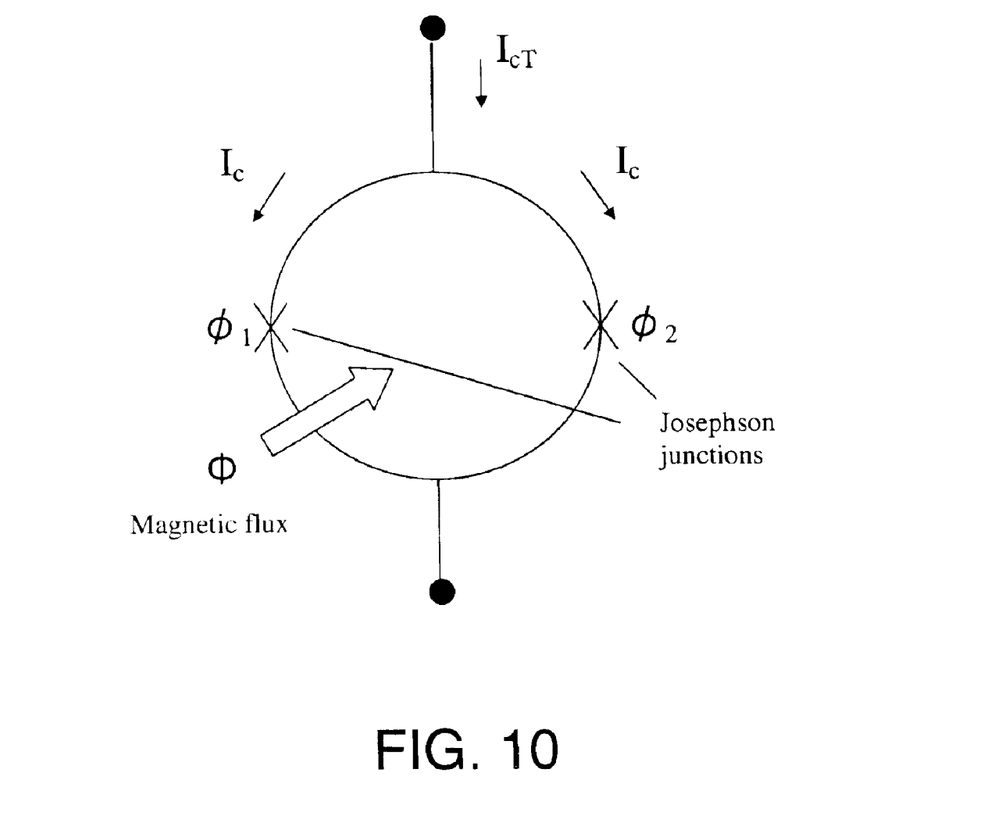
FIG. 10 is a schematic view of a superconducting quantum interference device.

FIG. 10 shows a superconducting quantum interference device to which the Josephson Junctions according to the present invention are applied. All or at least one of the Josephson Junctions comprise a Si substrate, a two layer film comprising an amorphous MgO layer and a high orientation MgO layer on the Si substrate, and a NbN film or a NbCN film laminated on the two layer film. In the superconducting quantum interference device, the NbN film or the NbCN film is used as an electrode.

Figure 11:
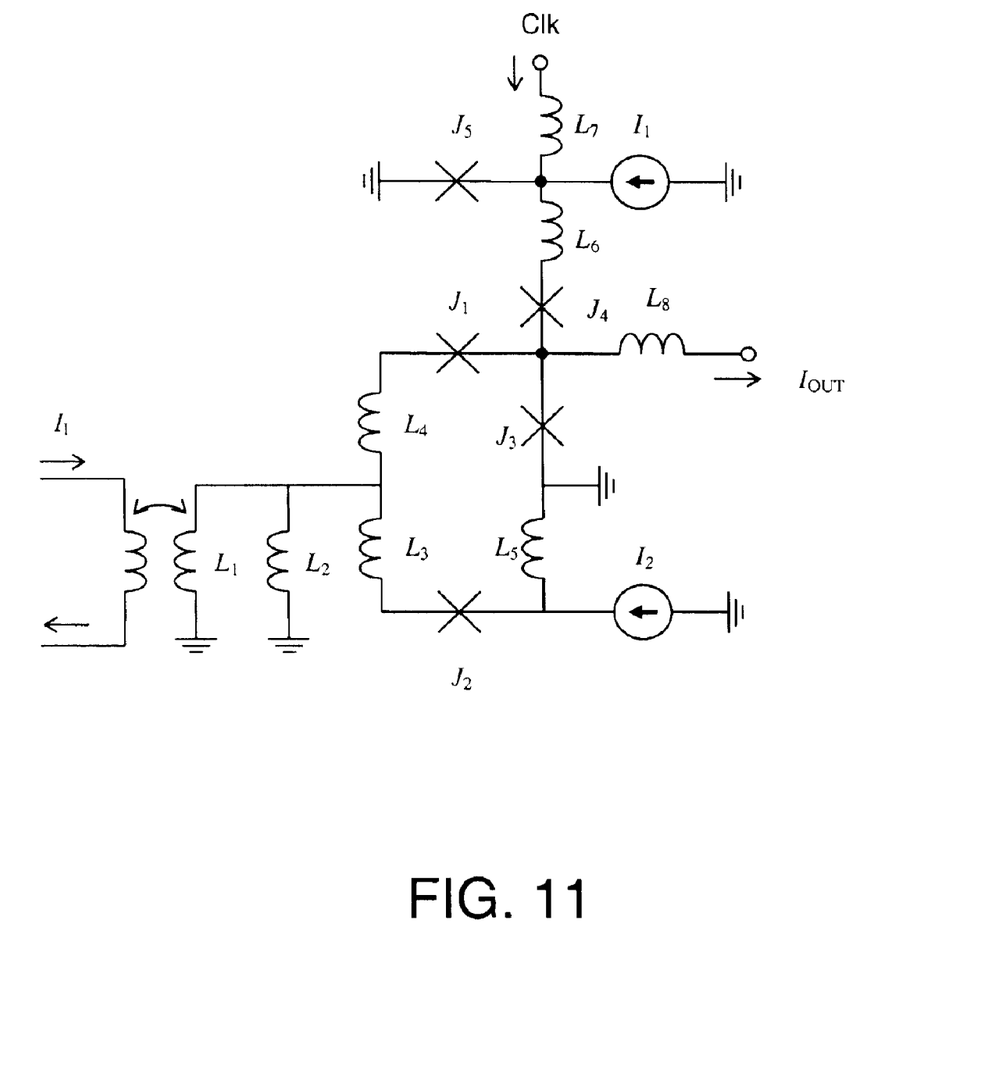
FIG. 11 is a schematic view of a superconducting digital integrated circuit (Comparator).

Further, Josephson junctions may be applied to a superconducting digital integrated circuit (Comparator). In FIG. 11, Josephson junctions $J_1$ to $J_5$ according to the present invention are shown. All or at least one of the Josephson Junctions comprise a Si substrate, a two layer film comprising an amorphous MgO layer and a high orientation MgO layer on the Si substrate, and a NbN film or a NbCN film laminated on the two layer film. In the superconducting quantum interference device, the NbN film or the NbCN film is used as an electrode.

Thus, the Josephson junction according to the present invention may be applied to any devices, apparatuses, systems, circuits and the like.

The following effects are acquired by adopting the method according to the present invention:

(1) It is possible to substantially reduce the cost since an inexpensive Si wafer having a large area is used instead of an expensive single crystal MgO substrate.

(2) Although an MgO substrate has restriction in a size, thickness, or form, if a Si wafer is used, the general-purpose process apparatus for semiconductors, such as i line stepper, can be used.

The disclosure of Japanese Patent Application No. 2002-240313 filed on Aug. 21, 2002 including specification, drawings and claims is incorporated herein by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A method for forming a Josephson junction, the method comprising the following steps of:

forming a two-layer film having an amorphous MgO layer and a high orientation MgO layer on a Si substrate; and laminating an NbN film or an NbCN film on the two-layer film.

2. The method according to claim 1, wherein the NbN film or the NbCN film is used as an electrode.

3. The Josephson junction formed by the method according to claim 1.

4. A Josephson junction comprising:

a Si substrate;

a two layer film comprising an amorphous MgO layer and a high orientation MgO layer on the Si substrate; and an NbN film or an NbCN film laminated on the two layer film.

5. The Josephson junction according to claim 4, wherein the NbN film or the NbCN film is used as an electrode.

6. A Josephson junction array comprising: at least one Josephson junction comprising a Si substrate, a two layer film comprising an amorphous MgO layer and a high orientation MgO layer on the Si substrate, and an NbN film or an NbCN film laminated on the two layer film.

7. The Josephson junction array according to claim 6, wherein the NbN film or the NbCN film is used as an electrode.

8. A digital to analog converter comprising: Josephson junction arrays comprising Josephson junctions, wherein at least one of the Josephson junctions comprises a Si substrate, a two layer film comprising an amorphous MgO layer and a high orientation MgO layer on the Si substrate, and an NbN film or an NbCN film laminated on the two layer film.

9. The Josephson junction array according to claim 8, wherein the NbN film or the NbCN film is used as an electrode.

10. A Josephson voltage generating apparatus comprising: a digital to analog converter comprising junction arrays for programmable converter using Josephson junctions, wherein at least one of the Josephson junctions comprises a Si substrate, a two layer film comprising an amorphous MgO layer and a high orientation MgO layer on the Si substrate, and an NbN film or an NbCN film laminated on the two layer film.

11. The Josephson junction array according to claim 10, wherein the NbN film or the NbCN film is used as an electrode.

12. A Josephson voltage standard apparatus comprising: a digital to analog converter comprising junction arrays for programmable converter using at least one Josephson junction, wherein at least one of the Josephson junctions comprises a Si substrate, a two layer film comprising an amorphous MgO layer and a high orientation MgO layer on the Si substrate and an NbN film or an NbCN film laminated on the two layer film.

13. The Josephson junction array according to claim 12, wherein the NbN film or the NbCN film is used as an electrode.

14. A superconducting sub-millimeter wave oscillator, comprising: at least one Josephson junction comprising a Si substrate, a two layer film comprising an amorphous MgO layer and a high orientation MgO layer on the Si substrate, and an NbN film or an NbCN film laminated on the two layer film.

15. The superconducting sub-millimeter wave oscillator, according to claim 14, wherein the NbN film or the NbCN film is used as an electrode.

16. A superconducting quantum interference device, comprising: at least one Josephson junction comprising a Si substrate, a two layer film comprising an amorphous MgO layer and a high orientation MgO layer on the Si substrate, and an NbN film or an NbCN film laminated on the two layer film.

17. The superconducting quantum interference device according to claim 16, wherein the NbN film or the NbCN film is used as an electrode.

18. A superconductivity digital integrated circuit comprising: at least one Josephson junction comprising a Si substrate, a two layer film comprising an amorphous MgO layer and a high orientation MgO layer on the Si substrate, and an NbN film or an NbCN film laminated on the two layer film.

19. The superconductive digital integrated circuit according to clam 18, wherein the NbN film or the NbCN film is used as an electrode.

20. A method for forming a device having a silicon substrate and an NbN or NbCN film, the method comprising the following steps of:

forming an amorphous MgO layer;

forming a high orientation MgO layer; and forming an NbN film or an NbCN film after forming the high orientation MgO layer, wherein the amorphous MgO layer is formed between the Si substrate and the high orientation MgO and the high orientation MgO layer is formed between the amorphous MgO layer and the NbN film or NbCN film.

21. A device comprising:

a Si substrate;

an amorphous MgO layer;

a high orientation MgO layer; and an NbN film or an NbCN film, wherein the amorphous MgO layer is formed between the Si substrate and the high orientation MgO and the high orientation MgO layer is formed between the amorphous MgO layer and the NbN film or NbCN film.

* * * * *